(12) United States Patent
Coimbra et al.

(10) Patent No.: US 11,251,780 B1
(45) Date of Patent: Feb. 15, 2022

(54) VOLTAGE LEVEL-SHIFTER

(71) Applicant: NXP B.V., Eindhoven (NL)

(72) Inventors: Ricardo Pureza Coimbra, Campinas (BR); Vitor Moreira Gomes, Campinas (BR)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/302,048

(22) Filed: Apr. 22, 2021

(51) Int. Cl.
*H03K 19/0185* (2006.01)
*H03K 3/037* (2006.01)

(52) U.S. Cl.
CPC ..... *H03K 3/037* (2013.01); *H03K 19/018521* (2013.01); *H03K 19/018528* (2013.01)

(58) Field of Classification Search
CPC ............... H03K 19/018521; H03K 19/018528
See application file for complete search history.

(56) References Cited

U.S. PATENT DOCUMENTS

| | | | |
|---|---|---|---|
| 7,205,819 B2* | 4/2007 | Davis | H03K 19/0016 326/63 |
| 7,295,038 B2 | 11/2007 | Seo | |
| 7,504,862 B2* | 3/2009 | De Sandre | H03K 19/01707 326/80 |
| 9,071,240 B2* | 6/2015 | Lin | H03K 19/018507 |
| 10,432,199 B1 | 10/2019 | Zhang | |
| 10,530,365 B1 | 1/2020 | Nascimento | |
| 2007/0268230 A1 | 11/2007 | Park et al. | |
| 2008/0204078 A1 | 8/2008 | O | |

* cited by examiner

*Primary Examiner* — Patrick O Neill

(57) ABSTRACT

An integrated circuit device includes a level shifter circuit with a supply voltage rail to provide a supply voltage, a first pull-up circuit coupled between the supply voltage rail and a first node, a second pull-up circuit coupled between the supply voltage rail and a second node, a first switch including a first terminal coupled to the supply voltage rail, a second terminal coupled to the first node, and a control terminal coupled to the second node, and an inverter including an input terminal coupled to the first node, a voltage supply terminal coupled to the supply voltage, and an output terminal to provide an output voltage from the level shifter circuit.

20 Claims, 4 Drawing Sheets

VOLTAGE LEVEL-SHIFTER

BACKGROUND

Field

This disclosure relates generally to integrated circuits, and more specifically, to a voltage level-shifter.

Related Art

Within System-on-Chips (SoCs) today, voltage level-shifters are commonly used for conversion or isolation of logic signals between different power domains (i.e. voltage domains). As SoCs evolve to include more power domains, level-shifters become critical "bottlenecks" of performance and power. Therefore, a need exists for improved level-shifting between power domains which can provide fast transitions times with low power consumption.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a level-shifter between power domains provides improved power-performance trade-offs by maintaining critical switching nodes with relatively high impedances prior to any switching event associated with positive feedback-loops which results in accelerating output transitions. After a switching event, the level-shifter "re-arms" itself during a predetermined time compatible with the synchronous system which includes the level-shifter in order to ensure the switching nodes are ready for the next switching event.

Figure 1:
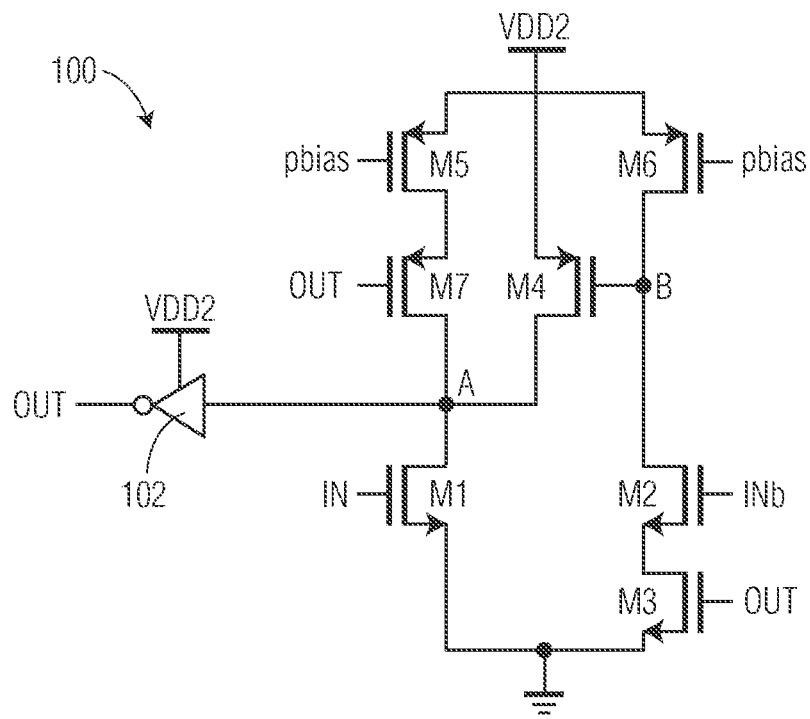
FIG. 1 illustrates, in schematic form, a level-shifter (LS) in accordance with one embodiment of the present invention.

FIG. 1 illustrates, in schematic form, a level-shifter (LS) 100 in accordance with one embodiment of the present invention. LS 100 includes an inverter 102 and transistors M1-M7, in which each transistor can be implemented as a metal-oxide-silicon field-effect-transistor (MOSFET). Transistors M1-M3 are n-type MOSFETs (i.e. NMOSs), and transistors M4-M7 are p-type MOSFETs (i.e. PMOSs). Each transistor of transistors M1-M7 may simply be referred to herein as M1-M7, respectively. In one embodiment, LS 100 is within a system which includes a first supply voltage node (also referred to as a first supply voltage rail) which supplies a first supply voltage, VDD1, a second supply voltage node (also referred to as a second supply voltage rail) which supplies a second supply voltage, VDD2, and a third voltage supply node which supplies a third supply voltage, ground (GND). In one embodiment, VDD2>VDD1>GND. Note that each of the first, second, and third voltage supply nodes may simply be referred to as VDD1, VDD2, and GND, respectively.

A first current electrode of M5 is coupled to VDD2 and a gate electrode of M5 is coupled to receive a bias voltage, pbias. A first current electrode of M7 is coupled to a second current electrode of M5 and a second current electrode of M7 is coupled to a circuit node A. A first current electrode of M4 is coupled to VDD2, a gate electrode of M4 is coupled to a circuit node B, and a second current electrode is coupled to circuit node A. A first current electrode of M6 is coupled to VDD2, a gate electrode is coupled to receive pbias, and a second current electrode of M6 is coupled to circuit node B. A first current electrode of M1 is coupled to circuit node A, a gate electrode of M1 is coupled to receive an input signal, IN, and a second current electrode of M1 is coupled to GND. A first current electrode of M2 is coupled to circuit node B and a gate electrode of M2 is coupled to receive an inverse of IN, INb. A first current electrode of M3 is coupled to a second current electrode of M2, and a second current electrode of M3 is coupled to GND. An input of inverter 102 is coupled to circuit node A, and an output of inverter 102 provides an output signal, OUT. Inverter 102 is powered by VDD2, and thus has a power electrode coupled to VDD2. The gate electrodes of M7 and M3 are coupled to receive OUT.

In operation, complementary digital input signals, IN and INb, are provided to LS 100 in which IN and INb belong to a first power domain, powered by VDD1, and therefore can each vary between zero and VDD1. LS 100 converts the input signals to a digital output signal, OUT, which belongs to a second power domain powered by VDD2, and can vary between zero and VDD2. For example, if IN is asserted and provided at VDD1, OUT is asserted but provided at VDD2. Therefore, LS 100 can be located at a boundary between the first and second power domains. Transistors M1-M4 and M7 operate as switches while M5 and M6 provide very low current sources which thus resemble high-impedance (hi-Z) pull-up loads. As used herein, a signal being high refers to a logic level one and a signal being low refers to a logic level zero. Also, for transistors M1-M4 and M7 (also referred to as switches M1-M4 and M7, respectively, or simply as M1-M4 and M7, respectively), when a transistor/switch is on or closed, it is in its conductive state, and when the transistor/switch is off or open, it is in its non-conductive state. (Therefore, for any of the transistors or switches, on and closed may be used interchangeably, and off and open may be used interchangeably.)

Figure 2:
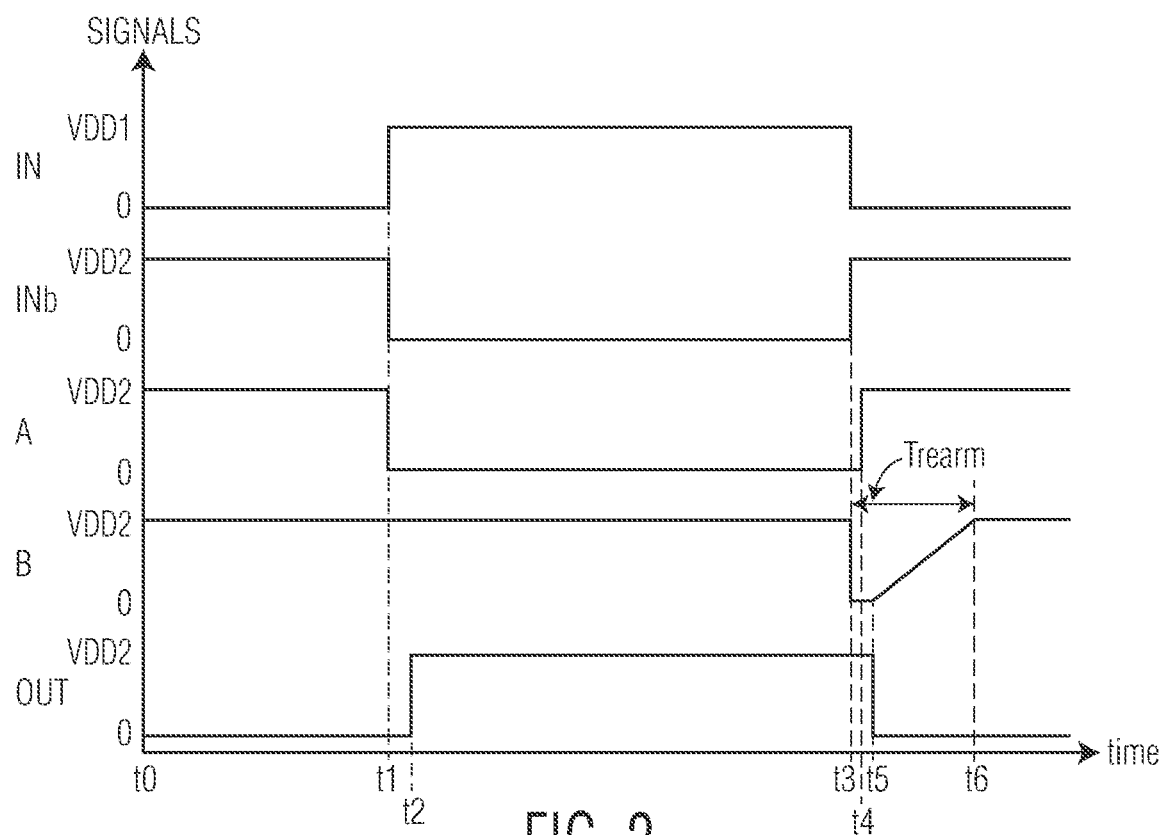
FIG. 2 illustrates a timing diagram for various signals within the level-shifter of FIG. 1, in accordance with one embodiment of the present invention.

Operation of LS 100 will be described in more detail in combination with the timing diagram of FIG. 2 which illustrates the voltage levels of IN, INb, circuit node A (also referred to as a first internal switching node), circuit node B (also referred to as a second internal switching node), and OUT. Initially, at time t0, IN is at a logic level zero, thus INb is at a logic level one (VDD1) and OUT is at a logic level zero. Since IN and OUT are at zero, M1 is off and M7 is on, and therefore M5 provides a weak pull-up which holds node A at VDD2. With OUT at zero, M3 is open, and therefore M6 pulls up and holds node B at VDD2 as well.

At time t1, IN toggles from logic level zero to logic level one (VDD1). At this point, M1 is turned on which shorts node A to GND with negligible opposition provided by M5 since M5 offers a weak pull-up that is easily overcome by M1. For example, M1's "short circuit" current (e.g. unlimited current) can be orders of magnitude greater the M5 source current (e.g. a limited current). Node A transitions quickly to GND causing OUT to toggle from zero to a logic level one (VDD2) in a timely manner (at time t2, shortly after time t1 upon propagating through inverter 102) which causes M7 to open. This zeros the current in the "left" branch of LS 100. Note that the "right" branch of LS 100 has no effect on the down-transition of node A from VDD2 to GND since at time t1, INb toggles to GND, immediately turning off M2. Therefore, even with OUT turning on M3, the series connection M2-M3 never closes and node B therefore remains pulled up at VDD2 by M6 (which also keeps M4 open). As will be seen, the purpose of the "right" branch is to enable a fast up-transition of node A from GND to VDD2.

At time t3, IN toggles from VDD1 back to GND, and M2 is turned on by INb. However, since OUT has not yet toggled back to GND, M3 is still closed which causes a fast down-transition of node B to GND since M6 offers a weak pull-up that is easily overcome by M3. With node B at GND, M4 is closed, shorting node A to VDD2 with no opposition from M1 which is currently open. (That is, when M4 is closed, an output of M4 can be described as providing a feedback voltage to the input of inverter 102.) At time t4, node A up-transitions quickly to VDD2 causing OUT to toggle to zero in a timely manner (at time t5, shortly after time t4 upon propagating through inverter 102) which causes M7 to close and M3 to open. Then, while M5 maintains node A at VDD2, M6, acting as a weak pull-up, makes node B slowly transition back to VDD2 (between times t5 and t6). Note that the time between node B falling to zero upon a high to low transition of IN until node B reaches VDD2 (i.e. time t3 to time t6) may be referred to as the re-arm time (Trearm). A next switching event (the switching of IN back to high, or VDD2), should not occur during the time Trearm. For this reason, the high-impedance pull-up (e.g. M6) is designed such that Trearm<Tcycle, in which Tcycle represents the cycle time of the synchronous system in which LS 100 operates (e.g. corresponding to a clock period of the circuit containing LS 100).

Note that while node B is high (at VDD2), M4 is off, which reduces power consumption of LS 100. However, upon a high to low transition of IN, M2 is closed (in response to the transition of INb to high) while M3 is still closed (since the resulting transition in OUT, which is feedback to M3, from high to low has not yet occurred). This brief overlap of both M2 and M3 being closed (due to the brief delay in the transition of OUT) allows B to be pulled quickly to GND to turn on M4. With M4 being on, A is quickly transitioned to VDD2. This results in OUT transitioning to low which is feedback to M3, thus turning off M3 (after node B has already been pulled low). With M3 off, node B can now be rearmed (pulled to VDD2) by the weak pull-up of M6 for the next transition of IN. Therefore, with the strong pull-up of M4 in parallel with the weak pull-ups of M5 and M6, as well as the feeding back of OUT to M3, M4 can be turned on only briefly when needed to transition OUT to low while M5 and M6 pull nodes A and B to VDD2 for the remainder of the time.

In an alternate embodiment, series connected M2 and M3 can be connected in reverse order (e.g. M3 may be coupled between node B and M2, and M2 may be coupled between M3 and GND). In another embodiment, M7 may not be present. In this case, when node A is pulled to GND, LS 100 would be consuming the M5 current at all times. However, with M7 present, as in FIG. 1, M7 is turned off when OUT is high which cuts off the static current.

Figure 3:
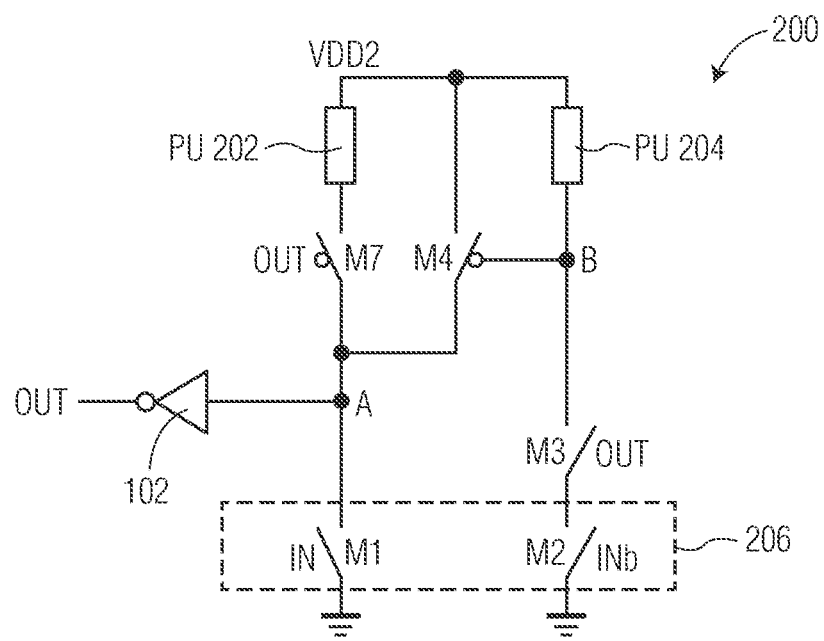
FIG. 3-7 illustrates, in partial schematic and partial block diagram form, level-shifters in accordance with embodiments of the present invention.

FIG. 3 illustrates, in block diagram form, an LS 200 which is a more generic version of LS 100, in which like reference numerals indicate like elements. In LS 200, switches M1-M4 and M7 correspond to transistors M1-M4 and M7, respectively, of LS 100. A circle on the switch (such as for switches M7 and M4) indicates that a low value of the control signal (OUT and B, respectively) closes the switch rather than a high value (as with switches M1, M2, and M3). M5 and M6 of LS 100 are each more generically drawn as a pull-up (PU) circuit (e.g. PU 202 and PU 204). PU 202 and PU 204 may also be collectively referred to as the pull-up network. PU 202 and PU 204 can be implemented with different circuitry to provide a current source which behaves as a hi-Z pull-up. M2 and M3 in LS 200 are illustrated in reverse order as compared to LS 100, to make it easier to identify a pull-down network 206 which includes both M1 and M2. Operation of LS 200 is analogous to operation of LS 100 which was described in reference to FIG. 2.

Figure 4:
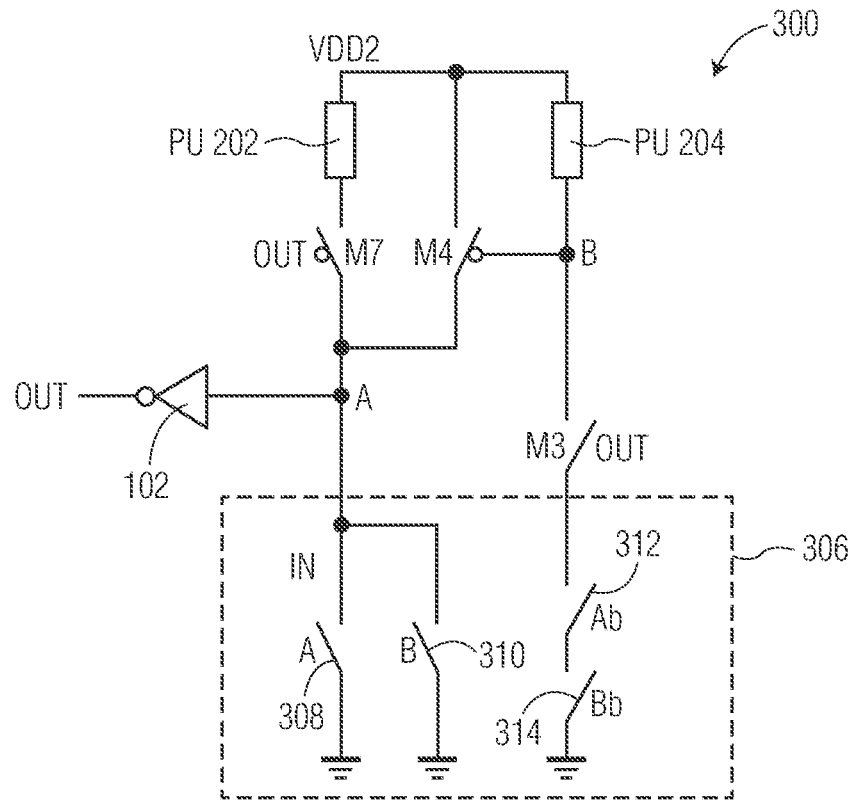
Figure 5:
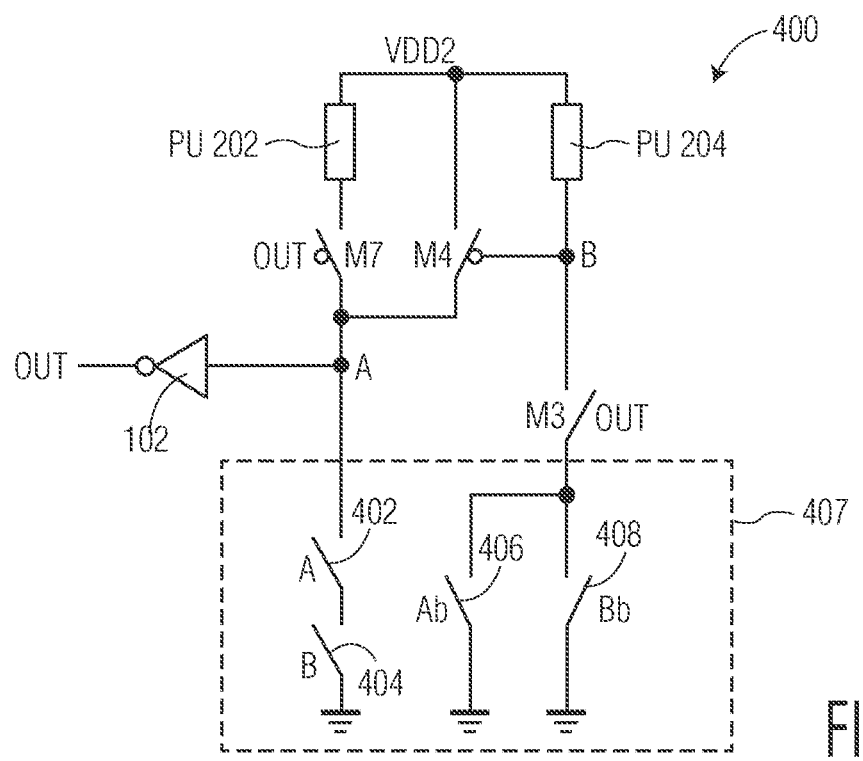
Figure 6:
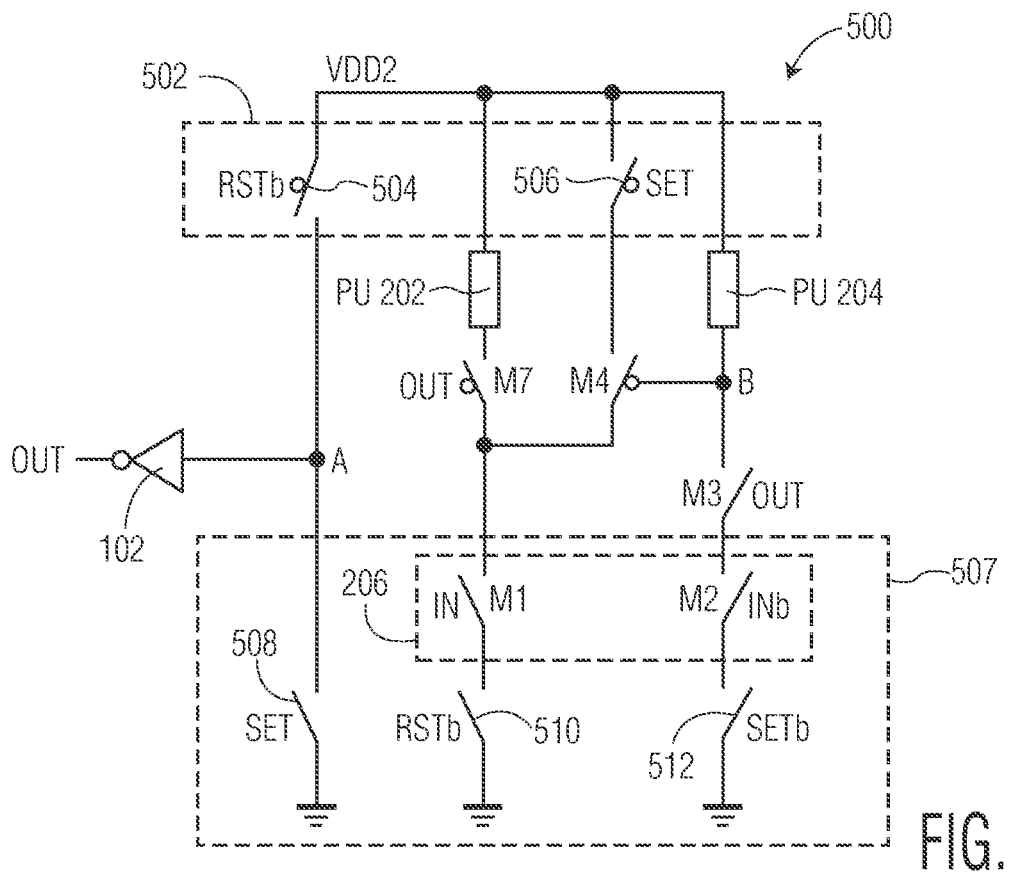

FIGS. 4-6 provide different embodiments of the pull-down network or pull-up network, or both, of FIG. 3, in which like numerals indicate like elements, and in which the pull-down network or pull-up network can also be used to implement a logic operation using more than one input. For example, IN and INb may be replaced by a desired logic expression and implemented through the corresponding pull-down network. FIG. 4 illustrates an LS 300, in which IN corresponds to the logic OR of two digital inputs X, Y, such that IN=X OR Y ("X+Y") and INb=Xb AND Yb ("NOT (X+Y)=NOT X·NOT Y"). This can be implemented as shown with pull-down network 306 of LS 300 in FIG. 4.

Referring to FIG. 4, in pull-down network 306, switch 308 is coupled in parallel with switch 310 between node A and GND, and switch 312 is coupled in series with switch 314 between M3 and GND. Therefore, just as M1 in LS 200 is closed to short node A to GND when IN is high, in LS 300, either switch 308 or switch 310 must be closed (either X must be high or Y must be high) to short node A to GND. Similarly, just as M2 in LS 200 is closed to connect M3 to GND when INb is low, in LS 300, both switches 312 and 314 must be closed (both X and Y must be low) to connect M3 to GND. The timing diagram and waveforms of FIG. 2 apply to LS 300 as well.

FIG. 5 illustrates an LS 400, in which IN corresponds to the logic AND of two digital inputs, X, Y, such that IN=X AND Y ("X·Y") and INb=Xb OR Yb ("NOT (X·Y)=NOT X+NOT Y"). In pull-down network 407, switch 402 is coupled in series with switch 404 between node A and GND, and switches 406 and 408 are coupled in parallel between M3 and GND. Therefore, just as M1 in LS 200 is closed to short node A to GND when IN is high, in LS 400, both X and Y must be high so that both switches 402 and 404 are closed to short node A to GND. Similarly, just as M2 in LS 200 is closed to connect M3 to GND when INb is low, in LS 400, either X or Y has to be low so that at least one of switches 406 or 408 is closed to connect M3 to GND. (Note that the timing diagram and waveforms of FIG. 2 apply to LS 300 and LS 400 as well).

Furthermore, pull-down and pull-up networks may be used to force a safe-state or some other initial condition. For example, this may be useful for power-up in which VDD1 and VDD2 may be sufficiently powered up at different times. FIG. 6 provides an LS 500 with additions of extra switches controlled by both SET and RESET (RST) signals to provide the desired states (e.g. safe states or initial states). Switch 504 is coupled between node A and VDD2 and is controlled by RSTb, switch 506 is coupled between M4 and VDD2 and is controlled by SET, switch 508 is coupled between node A and GND and is controlled by SET, switch 510 is coupled between pull-down network 206 (e.g. M1) and GND and controlled by RSTb, and switch 512 is coupled between pull-down network 206 (e.g. M2) and GND and controlled by SETb. Switches 504 and 506 include circles which indicates they are closed when their control input is low rather than high. Switches 504 and 506 can be implemented as PMOS transistors and switches 508, 510, and 512 can be implemented as NMOS transistors. Pull-down network 206 can be implemented in a variety of different ways using different combinations of inputs, as discussed with the examples of FIGS. 4 and 5.

In operation, when SET is asserted at a logic level high, node A is pulled low (GND) by closed switch 508, setting OUT to a logic level high (VDD2). With SET being high, switches 506 and 512 are open. When RST is asserted at a logic level high, node A is pulled high (VDD2) by closed switch 504, resetting OUT to a logic level low (GND). With RST being high, switch 510 is open. It is assumed that RST and SET are not asserted as the same time. Therefore, LS 500 may operate as described above in reference to LS 100, 200, 300, and 400, but may include the additional function of being able to set or reset OUT, as needed, to a logic level high or low, respectively.

Figure 7:
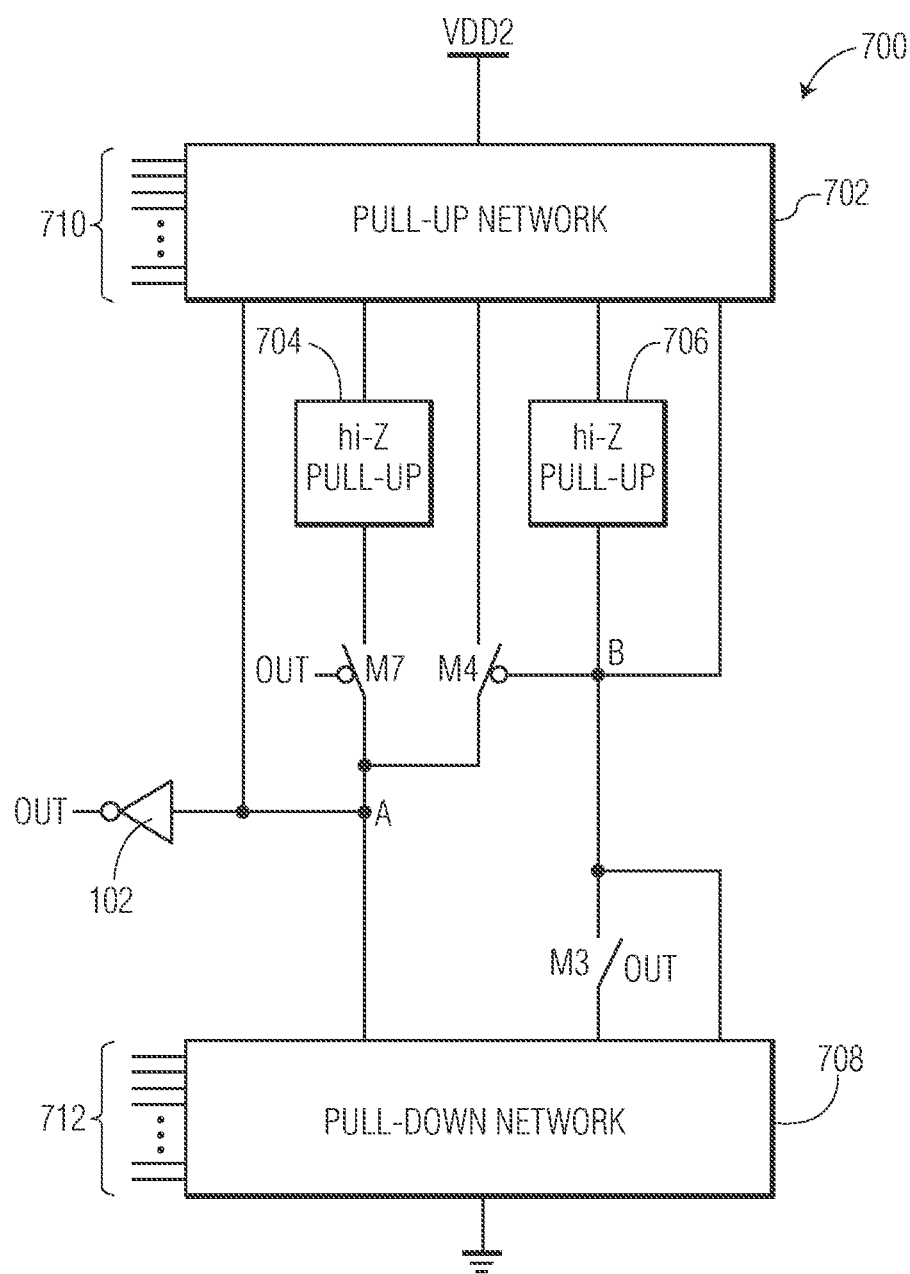

FIG. 7 illustrates, in block diagram form, an even further generic version of the level shifters described in FIGS. 1 and 3-6. FIG. 7 includes a LS 700, which includes inverter 203, M7, M4, and M3 coupled as described above in reference to FIG. 1. However, rather than M5 and M6, or PU 202 and PU 204, LS 700 includes a hi-Z pull-up circuit 704 coupled between M7 and a pull-up network 702 and a hi-Z pull-up circuit 706 coupled between node B and pull-up network 702. Each of hi-Z pull-up circuits 704 and 706 can be implemented as PMOS low-current sources such as M5 or M6, or may be implemented with different circuitry which also provides a hi-Z pull-up function, such has large resistors or pseudo-resistors. LS 700 also includes a pull-down network 708 coupled between node A and GND as well as between M3 and GND. Pull-up network 702 is also coupled to nodes A and B and to one or more additional inputs 710. Pull-down network 708 is also coupled to nodes A and B and to one or more additional inputs 712. Note that LS 700 can represent each of LS 100, 200, 300, 400, and 500 described herein. Note that in some of the embodiments, such as in LS 100 of FIG. 1, the pull-up or pull-down networks may simply be direct connections to VDD2 or GND, respectively. Each of pull-up network 702 and pull-down network 708 includes a switch network controlled through one or more digital inputs (e.g. inputs 710 and 712, respectively) according to any desired logic function to enable further control and flexibility. Note that nodes A and B may also be used as inputs for the desired logic functions.

By now it can be appreciated that there has been provided a LS which "re-arms" itself during a predetermined time compatible with the synchronous system which includes the level-shifter in order to ensure the switching nodes are ready for the next switching event. For example, in one embodiment, the LS re-arms itself after a logic level high to logic level low transition of the input signal, IN, by enabling a strong pull-up on a first internal switching node (A) to provide for a quick transition of the output, OUT, which is provided as feedback to a right branch of the level shifter containing a second internal switching node (B). However, prior to the transition of OUT to a logic level low, the second internal switching node (B) is pulled to a logic level low through switches controlled by IN and OUT. Upon OUT transitioning to low, the pull-down on the second internal switching node (B) is released such that it is slowly pulled back and maintained at a logic level high by a weak pull-up, re-arming it before the next transition of IN. With the second internal switching node (B) high again, the strong pull-up on the first internal switching node (A) is disabled. Through the limited use of the strong pull-up on the first internal switching node (A) in favor of weak pull-ups within the LS, reduced power consumption may be achieved. Also, by using additional switches to define different pull-up and pull-down networks for the LS, additional logic operations may also be performed by the LS.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name, a lower case "b" following the signal name, or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. Also, in embodiment, the illustrated elements of each of FIGS. 1 and 3-7 are circuitry located on a single integrated circuit or within a same device.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different implementations of the weak pull-ups may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a level shifter circuit including: a supply voltage rail to provide a supply voltage; a first pull-up circuit coupled between the supply voltage rail and a first node; a second pull-up circuit coupled between the supply voltage rail and a second node; a first switch including a first terminal coupled to the supply voltage rail, a second terminal coupled to the first node, and a control terminal coupled to the second node; and an inverter including an input terminal coupled to the first node, a voltage supply terminal coupled to the supply voltage, and an output terminal to provide an output voltage from the level shifter circuit. In one aspect, the level shifter further includes a second switch including a control terminal, a first terminal, and a second terminal, the second switch being coupled between the first pull-up circuit and the first node. In another aspect, the first and second pull-up circuits are high impedance pull-up transistors. In a further aspect, the first and second switches are P-type transistors. In another aspect of the above embodiment, the level shifter circuit further includes a pull-up network circuit including: a third switch including a first terminal coupled to the voltage supply rail and a second terminal coupled to the first node and a fourth switch including a first terminal coupled to the voltage supply rail and a second terminal coupled to the first terminal of the first switch. In yet another aspect, the level shifter circuit further includes a second switch that includes a first terminal coupled to the second node and a second terminal coupled to a pull-down network circuit; and the pull-down network circuit includes: a third switch including a first terminal coupled to the first node and a second terminal coupled to a ground voltage supply rail; a fourth switch including a first terminal coupled to the first node and the first terminal of the third switch, and a second terminal coupled to the ground voltage supply rail; and a fifth switch including a first terminal coupled to the second terminal of the second switch and a second terminal coupled to a first terminal of a sixth switch, wherein the sixth switch further includes a second terminal coupled to the ground voltage rail. In yet another aspect, the level shifter circuit further includes a second switch that includes a first terminal coupled to the second node and a second terminal coupled to a pull-down network circuit; and the pull-down network circuit includes: a third switch including a first terminal coupled to the first node and a second terminal coupled to a first terminal of a fourth switch; the fourth switch further including a second terminal coupled to the ground voltage rail; a fifth switch including a first terminal coupled to the second terminal of the second switch and a second terminal coupled to the ground voltage rail; and a sixth switch including a first terminal coupled to the second terminal of the second switch and a second terminal coupled to the ground voltage rail. In another aspect, the level shifter circuit further includes a fifth switch that includes a first terminal coupled to the second node and a second terminal coupled to a pull-down network circuit; and the pull-down network circuit includes: a sixth switch including a first terminal coupled to the first node and a second terminal coupled to the ground voltage rail; and a seventh switch including a first terminal coupled to the second terminal of the fifth switch and a second terminal coupled to the ground voltage rail. In a further aspect, the pull-down network circuit further includes: an eighth switch including a first terminal coupled to the first node and a second terminal coupled to a ground voltage supply rail; a ninth switch including a first terminal coupled to the second terminal of the sixth switch and a second terminal coupled to the ground voltage supply rail; and a tenth switch including a first terminal coupled to the second terminal of the seventh switch and a second terminal coupled to the ground voltage rail. In yet another aspect of the above embodiment, the level shifter circuit further includes: a pull-up network coupled between the first and second pull-up circuits and the supply voltage rail; and a pull-down network coupled between the first and second nodes and the ground voltage rail, wherein the pull-up network and the pull-down network are operable to place the level shifter circuit in a safe state.

In another embodiment, a level shifter circuit includes a first pull-up circuit coupled between a supply voltage rail and a first node; a second pull-up circuit coupled between the supply voltage rail and a second node; an inverter configured to provide an output to operate a third switch, the third switch is coupled between the second node and a ground voltage rail; and a fourth switch configured to provide feedback to an input of the inverter, the fourth switch is coupled between the supply voltage rail and the input to the inverter and is controlled by voltage at the second node. In one aspect, the integrated circuit further includes a pulldown circuit including a first switch coupled between the first node and the ground voltage rail, and a second switch coupled between the second node and the ground voltage rail. In a further aspect, the pulldown circuit further includes a fifth switch coupled between the first node and the ground voltage rail, and a sixth switch coupled between the second node and the ground voltage rail. In another aspect of the another embodiment, the integrated circuit further includes a seventh switch being coupled between the first pull-up circuit and the first node and controlled by the output of the inverter.

In yet another embodiment, a method for operating a level shifter circuit includes providing a first current from a first pull-up circuit, the first pull-up circuit is coupled between a supply voltage rail and a first node; providing a second current from a second pull-up circuit, the second pull-up circuit is coupled between the supply voltage rail and a second node; applying an input voltage to operate a first switch, the first switch is coupled between the first node and a ground voltage rail; applying output voltage from an inverter to operate a third switch, the third switch is coupled between the second node and the ground voltage rail; and providing feedback voltage from output of a fourth switch to an input of the inverter when the input voltage is removed, the fourth switch is coupled between the supply voltage rail and the input to the inverter and is controlled by the voltage at the second node. In one aspect, the method further includes applying an inverse of the input voltage to operate gate of a second switch, the second switch is coupled in series with the third switch between the second node and the ground voltage rail. In another aspect, the method further includes providing the first current by applying a bias voltage to a control gate of a first P-type transistor, wherein the first P-type transistor includes a source electrode coupled to the supply voltage rail and a drain electrode coupled to the first node; providing the second current by applying the bias voltage to a control gate of a second P-type transistor, wherein the second P-type transistor includes a source electrode coupled to the supply voltage rail and a drain electrode coupled to a second node. In a further aspect, the method includes disabling at least a portion of the level shifter circuit by operating at least one of a group consisting of: a pull-up circuit coupled between the supply voltage rail and the first and second pull-up circuits, and a pull-down circuit that includes the first and second switches. In another aspect of the yet another embodiment, the method further includes providing sufficient current through the first and second pull-up circuits to enable voltage at the second node to transition from low potential to high potential within a specified time after the input voltage is removed. In another aspect, the method further includes operating the first, second, and additional switches in the pull-down circuit using voltages at the first and second nodes instead of the input voltage and the inverse of the input voltage.

What is claimed is:

1. An integrated circuit device comprising:
a level shifter circuit including:
    a supply voltage rail to provide a supply voltage;
    a first pull-up circuit coupled between the supply voltage rail and a first node;
    a second pull-up circuit coupled between the supply voltage rail and a second node;
    a first switch including a first terminal coupled to the supply voltage rail, a second terminal coupled to the first node, and a control terminal coupled to the second node;
    an inverter including an input terminal coupled to the first node, a voltage supply terminal coupled to the supply voltage, and an output terminal to provide an output voltage from the level shifter circuit.

2. The integrated circuit device of claim 1, the level shifter circuit further including:
    a second switch including a control terminal, a first terminal, and a second terminal, the second switch being coupled between the first pull-up circuit and the first node.

3. The integrated circuit device of claim 1 wherein:
the first and second pull-up circuits are high impedance pull-up transistors.

4. The integrated circuit device of claim 2 wherein:
the first and second switches are P-type transistors.

5. The integrated circuit device of claim 1, the level shifter circuit further including:
    a pull-up network circuit including:
        a third switch including a first terminal coupled to the voltage supply rail and a second terminal coupled to the first node and
        a fourth switch including a first terminal coupled to the voltage supply rail and a second terminal coupled to the first terminal of the first switch.

6. The integrated circuit device of claim 1, wherein:
the level shifter circuit further includes a second switch that includes a first terminal coupled to the second node and a second terminal coupled to a pull-down network circuit;
the pull-down network circuit including:
    a third switch including a first terminal coupled to the first node and a second terminal coupled to a ground voltage supply rail;
    a fourth switch including a first terminal coupled to the first node and the first terminal of the third switch, and a second terminal coupled to the ground voltage supply rail; and
    a fifth switch including a first terminal coupled to the second terminal of the second switch and a second terminal coupled to a first terminal of a sixth switch, wherein the sixth switch further including a second terminal coupled to the ground voltage rail.

7. The integrated circuit device of claim 1, wherein:
the level shifter circuit further includes a second switch that includes a first terminal coupled to the second node and a second terminal coupled to a pull-down network circuit;
the pull-down network circuit including:
    a third switch including a first terminal coupled to the first node and a second terminal coupled to a first terminal of a fourth switch;
    the fourth switch further including a second terminal coupled to the ground voltage rail;
    a fifth switch including a first terminal coupled to the second terminal of the second switch and a second terminal coupled to the ground voltage rail;
    a sixth switch including a first terminal coupled to the second terminal of the second switch and a second terminal coupled to the ground voltage rail.

8. The integrated circuit device of claim 5, wherein:
the level shifter circuit further includes a fifth switch that includes a first terminal coupled to the second node and a second terminal coupled to a pull-down network circuit;
the pull-down network circuit includes:
    a sixth switch including a first terminal coupled to the first node and a second terminal coupled to the ground voltage rail;
    a seventh switch including a first terminal coupled to the second terminal of the fifth switch and a second terminal coupled to the ground voltage rail.

9. The integrated circuit device of claim 8, wherein:
the pull-down network circuit further includes:
    an eighth switch including a first terminal coupled to the first node and a second terminal coupled to a ground voltage supply rail;
    a ninth switch including a first terminal coupled to the second terminal of the sixth switch and a second terminal coupled to the ground voltage supply rail; and
    a tenth switch including a first terminal coupled to the second terminal of the seventh switch and a second terminal coupled to the ground voltage rail.

10. The integrated circuit device of claim 1, the level shifter circuit further including:
    a pull-up network coupled between the first and second pull-up circuits and the supply voltage rail; and
    a pull-down network coupled between the first and second nodes and the ground voltage rail, wherein the pull-up network and the pull-down network are operable to place the level shifter circuit in a safe state.

11. A level shifter circuit comprising:
a first pull-up circuit coupled between a supply voltage rail and a first node;
a second pull-up circuit coupled between the supply voltage rail and a second node;
an inverter configured to provide an output to operate a third switch, the third switch is coupled between the second node and a ground voltage rail; and
a fourth switch configured to provide feedback to an input of the inverter, the fourth switch is coupled between the supply voltage rail and the input to the inverter and is controlled by voltage at the second node.

12. The integrated circuit of claim 11 further comprising:
a pulldown circuit including a first switch coupled between the first node and the ground voltage rail, and a second switch coupled between the second node and the ground voltage rail.

13. The integrated circuit of claim 12, the pulldown circuit further comprising:
a fifth switch coupled between the first node and the ground voltage rail, and a sixth switch coupled between the second node and the ground voltage rail.

14. The integrated circuit of claim 11 further comprising:
a seventh switch being coupled between the first pull-up circuit and the first node and controlled by the output of the inverter.

15. A method for operating a level shifter circuit, the method comprising:
providing a first current from a first pull-up circuit, the first pull-up circuit is coupled between a supply voltage rail and a first node;
providing a second current from a second pull-up circuit, the second pull-up circuit is coupled between the supply voltage rail and a second node;
applying an input voltage to operate a first switch, the first switch is coupled between the first node and a ground voltage rail;
applying output voltage from an inverter to operate a third switch, the third switch is coupled between the second node and the ground voltage rail; and
providing feedback voltage from output of a fourth switch to an input of the inverter when the input voltage is removed, the fourth switch is coupled between the supply voltage rail and the input to the inverter and is controlled by the voltage at the second node.

16. The method of claim 15 further comprising:
applying an inverse of the input voltage to operate gate of a second switch, the second switch is coupled in series with the third switch between the second node and the ground voltage rail.

17. The method of claim 15 further comprising:
providing the first current by applying a bias voltage to a control gate of a first P-type transistor, wherein the first P-type transistor includes a source electrode coupled to the supply voltage rail and a drain electrode coupled to the first node;
providing the second current by applying the bias voltage to a control gate of a second P-type transistor, wherein the second P-type transistor includes a source electrode coupled to the supply voltage rail and a drain electrode coupled to a second node.

18. The method of claim 16 further comprising:
disabling at least a portion of the level shifter circuit by operating at least one of a group consisting of: a pull-up circuit coupled between the supply voltage rail and the first and second pull-up circuits, and a pull-down circuit that includes the first and second switches.

19. The method of claim 15 further comprising:
providing sufficient current through the first and second pull-up circuits to enable voltage at the second node to transition from low potential to high potential within a specified time after the input voltage is removed.

20. The method of claim 18 further comprising:
operating the first, second, and additional switches in the pull-down circuit using voltages at the first and second nodes instead of the input voltage and the inverse of the input voltage.

\* \* \* \* \*